(12) United States Patent
Chen et al.

(10) Patent No.: US 7,478,668 B2
(45) Date of Patent: Jan. 20, 2009

(54) HEAT DISSIPATION DEVICE

(75) Inventors: Yong-Dong Chen, Shenzhen (CN); Guang Yu, Shenzhen (CN); Shih-Hsun Wung, Taipei Hsien (TW); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 65 days.

(21) Appl. No.: 11/564,265

(22) Filed: Nov. 28, 2006

(65) Prior Publication Data

US 2008/0121368 A1    May 29, 2008

(51) Int. Cl.
*H05K 7/20* (2006.01)

(52) U.S. Cl. ............... 165/104.33; 165/151; 361/697; 361/700

(58) Field of Classification Search ............ 165/104.33, 165/151; 361/697, 700; 257/714
See application file for complete search history.

(56) References Cited

U.S. PATENT DOCUMENTS

| | | | | |
|---|---|---|---|---|
| 1,893,521 A * | 1/1933 | Modine | ................ | 165/151 |
| 2,046,791 A * | 7/1936 | Przyborowski | ........... | 165/151 |
| 4,775,007 A * | 10/1988 | Sakuma et al. | ........... | 165/151 |
| 4,854,380 A * | 8/1989 | Yoshida et al. | ........... | 165/151 |
| 4,869,316 A * | 9/1989 | Yoshida et al. | ........... | 165/151 |
| 5,009,263 A * | 4/1991 | Seshimo et al. | ........... | 165/151 |
| 5,567,986 A | 10/1996 | Ishida | | |
| 6,598,295 B1 * | 7/2003 | Utter | ................ | 165/151 |
| 7,215,548 B1 * | 5/2007 | Wu et al. | ........... | 165/104.33 |
| 7,249,626 B2 * | 7/2007 | Hao et al. | ........... | 165/104.33 |
| 7,304,845 B2 * | 12/2007 | Xia et al. | ........... | 361/697 |
| 2001/0037875 A1 | 11/2001 | Mays | | |
| 2004/0244947 A1 | 12/2004 | Chen | | |
| 2005/0126762 A1 * | 6/2005 | Lin | ................ | 165/104.33 |
| 2006/0219392 A1 * | 10/2006 | Lin | ................ | 165/104.33 |
| 2006/0266500 A1 * | 11/2006 | Lin et al. | ........... | 165/104.33 |
| 2006/0289150 A1 * | 12/2006 | Lee et al. | ........... | 165/104.33 |

FOREIGN PATENT DOCUMENTS

| | | |
|---|---|---|
| CN | 2682474 | 3/2005 |
| CN | 2770091 | 4/2006 |
| TW | 388608 | 4/2000 |
| TW | 577580 | 2/2004 |
| TW | M279916 | 11/2005 |

* cited by examiner

*Primary Examiner*—Leonard R Leo
(74) *Attorney, Agent, or Firm*—Frank R. Niranjan

(57) ABSTRACT

A heat dissipation device includes a base and a fin set arranged on the base. The fin set includes a plurality of fins each having an undulating body and two flanges extending from the body. The body includes a plurality of peak faces, a plurality of trough faces alternating with the peak faces and a plurality of slanted faces each connecting adjacent peak face and trough face. The peak faces of each fin conform to the peak faces of an adjacent fin, while the trough faces of each fin conform to the trough faces of the adjacent fin. Pluralities of undulating passages are defined between two adjacent fins. Each heat pipe has a first section contacting the base and a second section extending through the fin set. A fan is located corresponding to the passages of the fin set for providing forced airflow to the fin set.

11 Claims, 5 Drawing Sheets

HEAT DISSIPATION DEVICE

BACKGROUND OF THE INVENTION

1. Field of the Invention

The present invention relates to heat dissipation devices, and more particularly to a heat dissipation device for use in removing heat from electronic devices.

2. Description of Related Art

During operation of an electronic device such as a computer central processing unit (CPU) in a computer enclosure, a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device comprises a solid metal base attached to the CPU, and a plurality of flat fins arranged on the base. The base is intimately attached to the CPU thereby allowing it to absorb the heat generated by the CPU. Most of the heat accumulated at the base is transferred firstly to the fins and then dissipates away from the fins. However, as electronics technology continues to advance, increasing amounts of heat are being generated by powerful state-of-the-art CPUs. Therefore, unless size or number of the fins of the foresaid heat dissipation device increase in accordance with the increase of the heat generated by the CPUs their heat dissipation capacity will be insufficient. Unfortunately, the heat dissipation device with increasing size or number fins becomes larger and occupies a greater proportion of the limited space in the computer enclosure, which results in obstructed convection of air in the computer enclosure. Therefore, the heat dissipation device needs to be improved to meet with the heat dissipation demand of the CPUs.

What is needed, therefore, is a heat dissipation device which can achieve a greater heat dissipation capability for heat generating electronic device.

SUMMARY OF THE INVENTION

A heat dissipation device in accordance with a preferred embodiment of the present invention comprises a base for absorbing heat from a heat generating device and a fin set arranged on the base. The fin set comprises a plurality of fins each having an undulating body and two flanges extending from two opposite edges of the body. The body comprises a plurality of peak faces, a plurality of trough faces alternating with the peak faces and a plurality of slanted faces each connecting adjacent peak face and trough face. The peak faces of each of the fins conform to the peak faces of an adjacent fin of the fin set, while the trough faces of each fin conform to the trough faces of the adjacent fin of the fin set. A plurality of undulating passages is defined between two adjacent fins of the fin set. At least a heat pipe has a first section contacting the base and a second section extending through the fin set for transferring heat from the base to the fin set. A fan is located corresponding to the passages of the fin set for providing forced airflow to the fin set.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
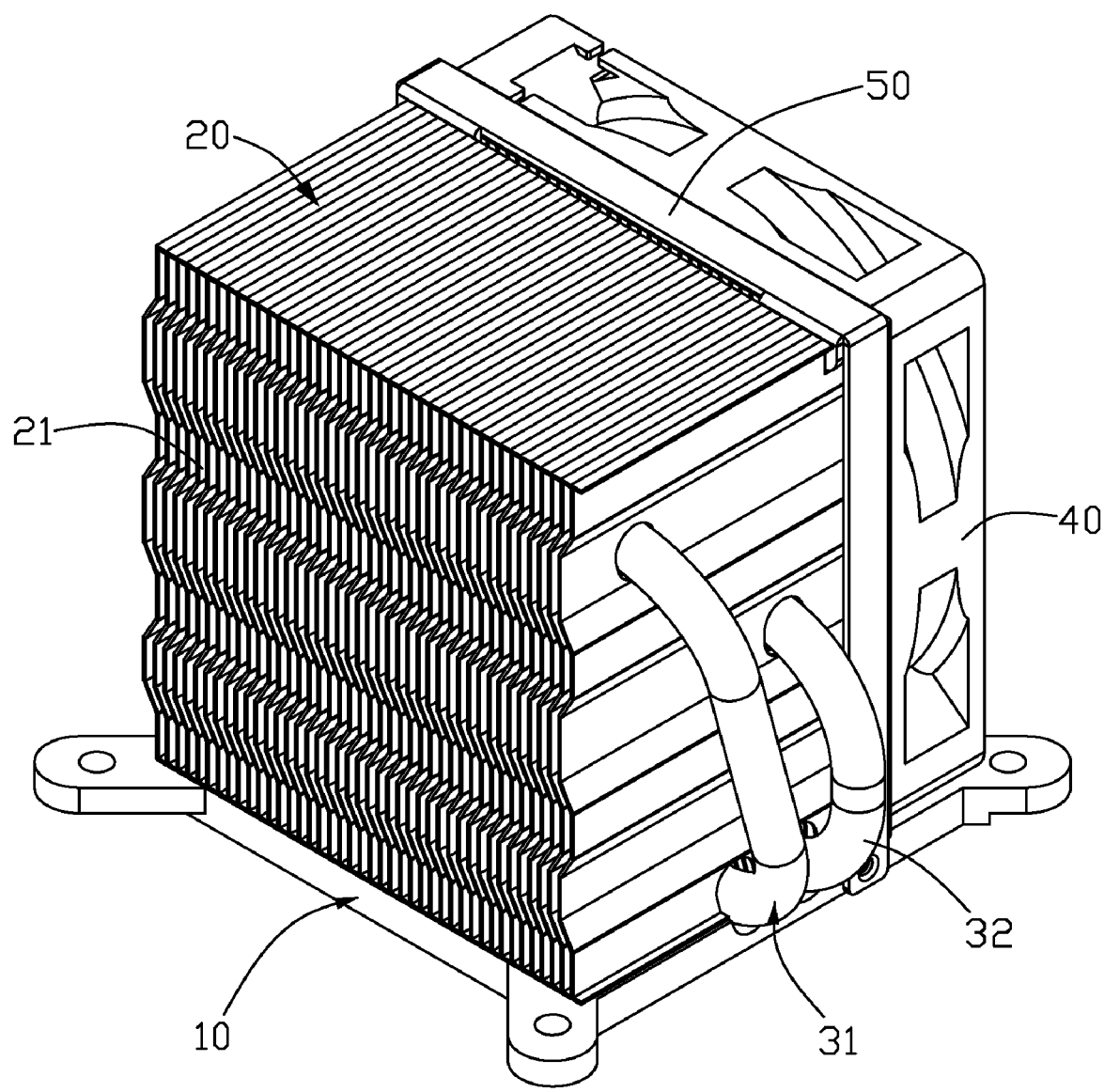
FIG. 1 is an assembled, isometric view of a heat dissipation device in accordance with a preferred embodiment of the present invention.
Figure 2:
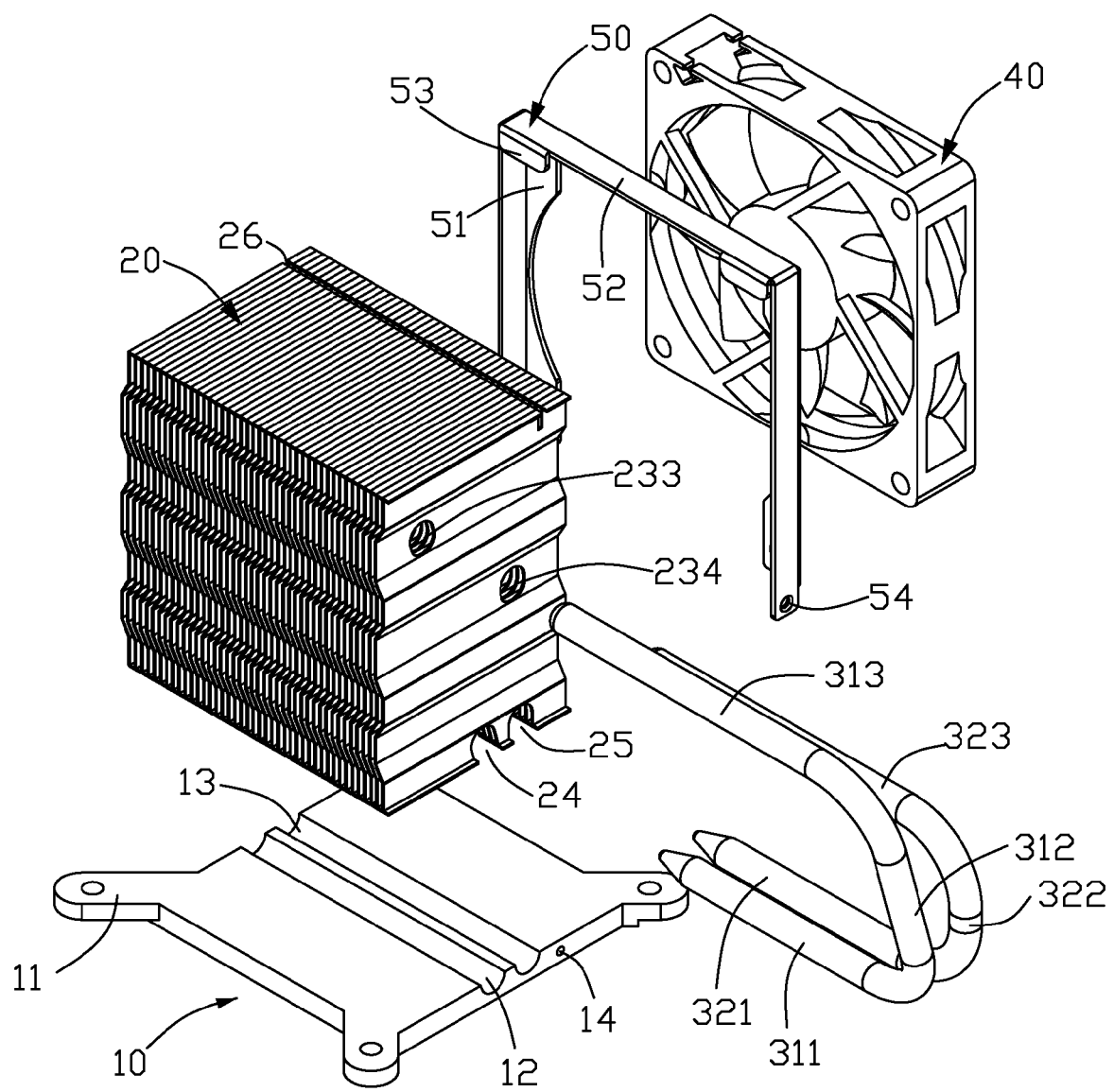
FIG. 2 is an exploded view of the heat dissipation device of FIG. 1.
Figure 3:
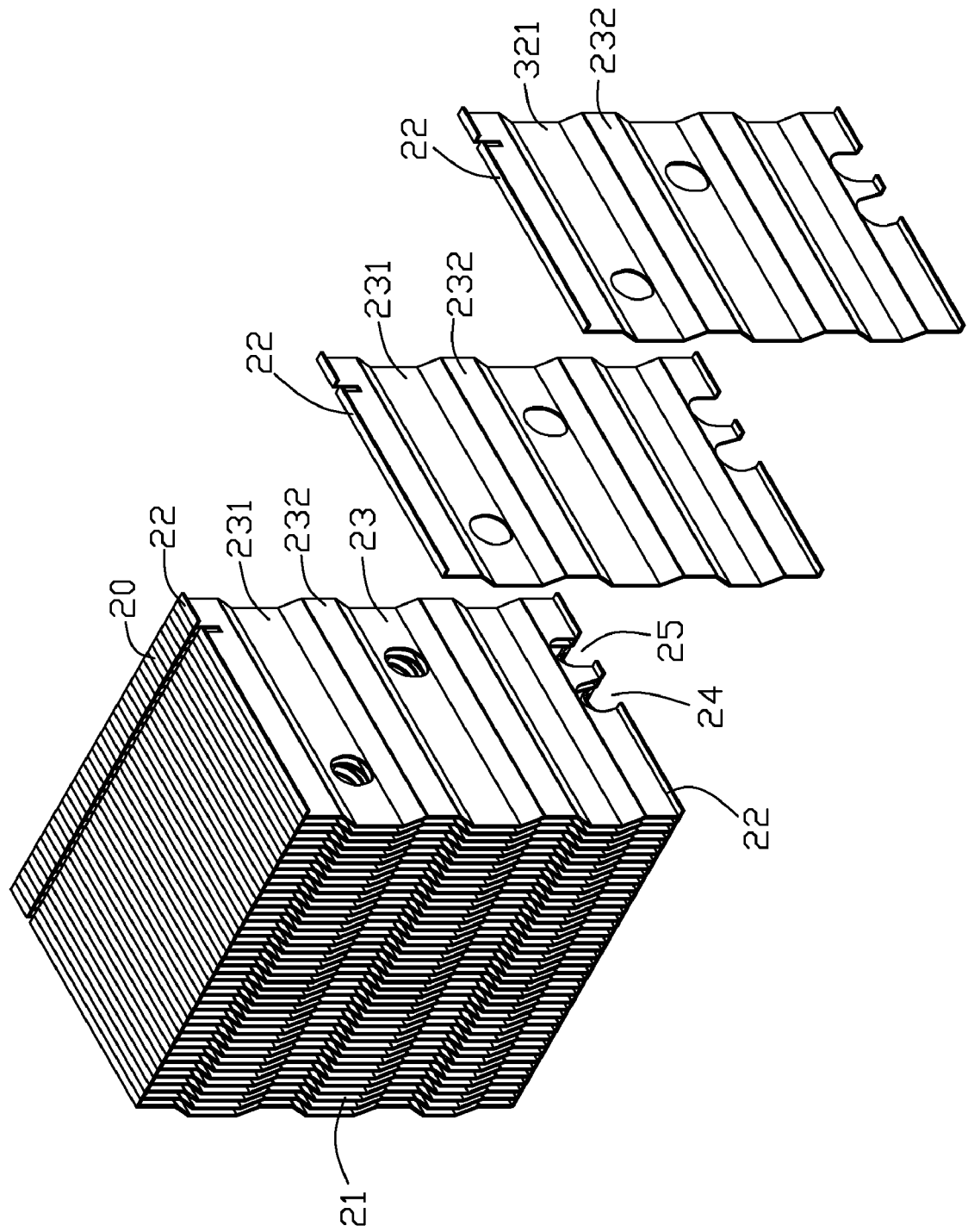
FIG. 3 shows a fin set of the heat dissipation device of FIG. 2 with two fins of the fin set being detached from the other ones.

Referring to FIGS. 1-3, a heat dissipation device in accordance with a preferred embodiment of the invention comprises a base 10, a fin set 20, first, second heat pipes 31, 32 connecting the base 10 and the fin set 20 for transferring heat from the base 10 to the fin set 20, and a fan 40 attached to a side of the fin set 20 by a fan holder 50, for providing forced airflow to the fin set 20.

The base 10 is made from good heat conducting metal plate, such as copper plate, aluminum plate or the like, and comprises a substantially rectangular main body (not labeled) and four legs 11 extending from four corners of the main body, for fixing the heat dissipation device to a printed circuit board (not shown) on which an electronic device mounted. A first groove 12 and a second groove 13 are defined parallel in a top face of the main body of the base 10, for receiving the first and second heat pipes 31, 32 therein. Each of the first and second grooves 12, 13 has an arced section. Two opposite lateral faces of the base 10 each defines a fixing hole 1 4 outside the second groove 13 for fixing the fan holder 50 to the base 10 by a fastener such as a screw (not shown).

The fin set 20 is arranged and secured on the top face of the base 10 by soldering. The fin set 20 comprises a plurality of fins 21 thermally contacting the base 10. Each fin 21 of the fin set 20 is made from heat conducting metal sheeting such as copper sheeting, aluminum sheeting or the like. Each fin 21 comprises an undulating body 23 and top and bottom flanges 22 extending from two opposite edges of the body 23. The two flanges 22 of each fin abut the body 23 of an adjacent fin 21 of the fin set 20; thus, the flanges 22 of the fins 21 of the fin set 20 form top and bottom faces at two opposite sides of the bodies 23 of the fins 21 of the fin set 20. Each fin 21 defines first and second cutouts (not labeled) extending from the bottom flange 22 to the body 23 thereof corresponding to the first and second grooves 12,13 of the base 10. The cutouts of all the fins 21 of the fin set 20 cooperatively define parallel first, second grooves 24, 25 extending through the bottom face thereof, for receiving the first, second heat pipes 31, 32 therein. A slit 26, extending through the top flanges 22 of the fins 21 of the fin set 20, is defined in the top face of the fin set 20 and adjacent to one lateral end of the fin set 20, for positioning the fan holder 50 to the fin set 20. An upper through channel 233 and a lower through channel 234 transversely extend through the bodies 23 of the fins 21 of the fin set 20, for extension of the first, second heat pipe 31, 32. The body 23 of each fin 21 comprises a plurality of trough faces 231, a plurality of peak faces 232 alternating with the trough faces 231, and slanted faces (not labeled) each connecting with the adjacent trough face 231 and peak face 232. Each trough face 231 of each body 23 of each fin 21 is positioned corresponding to an adjacent trough face 231 of the adjacent body 23 of an adjacent fin 21. Each peak face 232 of each body 23 is positioned corresponding to an adjacent peak face 232 of the adjacent body 23. A plurality of passages (not labeled) for airflow is defined between adjacent fins 21 of the fin set 20. Each of the passages between adjacent fins 21 is undulating too.

The first heat pipe 31 is substantially U-shaped, and comprises a first transfer section 311, a second transfer section 313 parallel to the first transfer section 311, and a connecting section 312 connecting with the first, second transfer sections 311, 313. A rounder corner is formed at each joint of the first transfer section 311, connecting section 312 and the second transfer section 313. The second heat pipe 32 is similar to the first heat pipe 31, and comprises a first transfer section 321, a connecting section 322 and a second transfer section 323. The first transfer sections 311, 312 are received in the corresponding first, second grooves 12, 13 of the base 10 and the first, second grooves 24, 25 of the fin set 20. The second transfer sections 313, 323 of the first and second heat pipes 31, 32 are received in the corresponding upper through channel 233 and the lower through channel 234, respectively. The connecting sections 312, 322 of the first and second heat pipes 31, 32 are located at a side of the fin set 20.

The fan holder 50 comprises a faceplate 51 for holding the fan 40, and a U-shaped frame 52 extending from three edges of the faceplate 51 for fixing the fan holder 50 to the fin set 20. The faceplate 51 defines an opening (not labeled) exposed to the fan 40. The fan 40 is secured to the faceplate 51. The frame 52 comprises two opposite lateral lath (not labeled) sandwiching the fin set 20 therebetween and a top lath located on the top face of the fin set 20. The two lateral and top laths of frame 52 all are perpendicular to the faceplate 51. A lower end of each of the lateral laths defines a through aperture 54 corresponding to the fixing hole 14 of the base 10, and is fixed to the base 10 by a fastener such as a screw (not shown) engaged in the through aperture 54 and the fixing hole 14. The top lath of the frame 52 extends two positioning tabs 53 adjacent two ends thereof. The two positioning tabs 53 are positioned in the slit 26 of the fin set 20. Therefore, the fan holder 50 and the fan 40 are attached to the fin set 20.

In use, the heat dissipation device is secured to the electronic device with the bottom face of the base 10 intimately contacting the electronic device. The base 10 absorbs heat from the electronic device. Part of the heat in the base 10 is absorbed by the first transfer sections 311, 321 of the first, second heat pipes 31, 32, and is transferred to middle and upper portions of the fin set 20 by the connecting sections 312, 322 and the second transfer sections 313, 323 of the first, second heat pipes 31, 32. Part of the heat in the base 10 is directly transferred to a lower portion of the fin set 20. Subsequently, the heat in the fin set 20 is rapidly dissipated to ambient air by the fan 40.

According to the heat dissipation device of the preferred embodiment of the present invention, the body 23 of each fin of the fin set 20 is undulating in shape, thereby increasing area of the fins of the fin set 20 in a certain volume in comparison with the heat dissipation device of the related art. It can thus be seen that as heat dissipation area of the heat dissipation device increases heat dissipation capacity of the heat dissipation device is improved. Furthermore, the passages between the fins are undulating, therefore fully heat exchange can be realized between the fins and the airflow in the passages.

Figure 4:
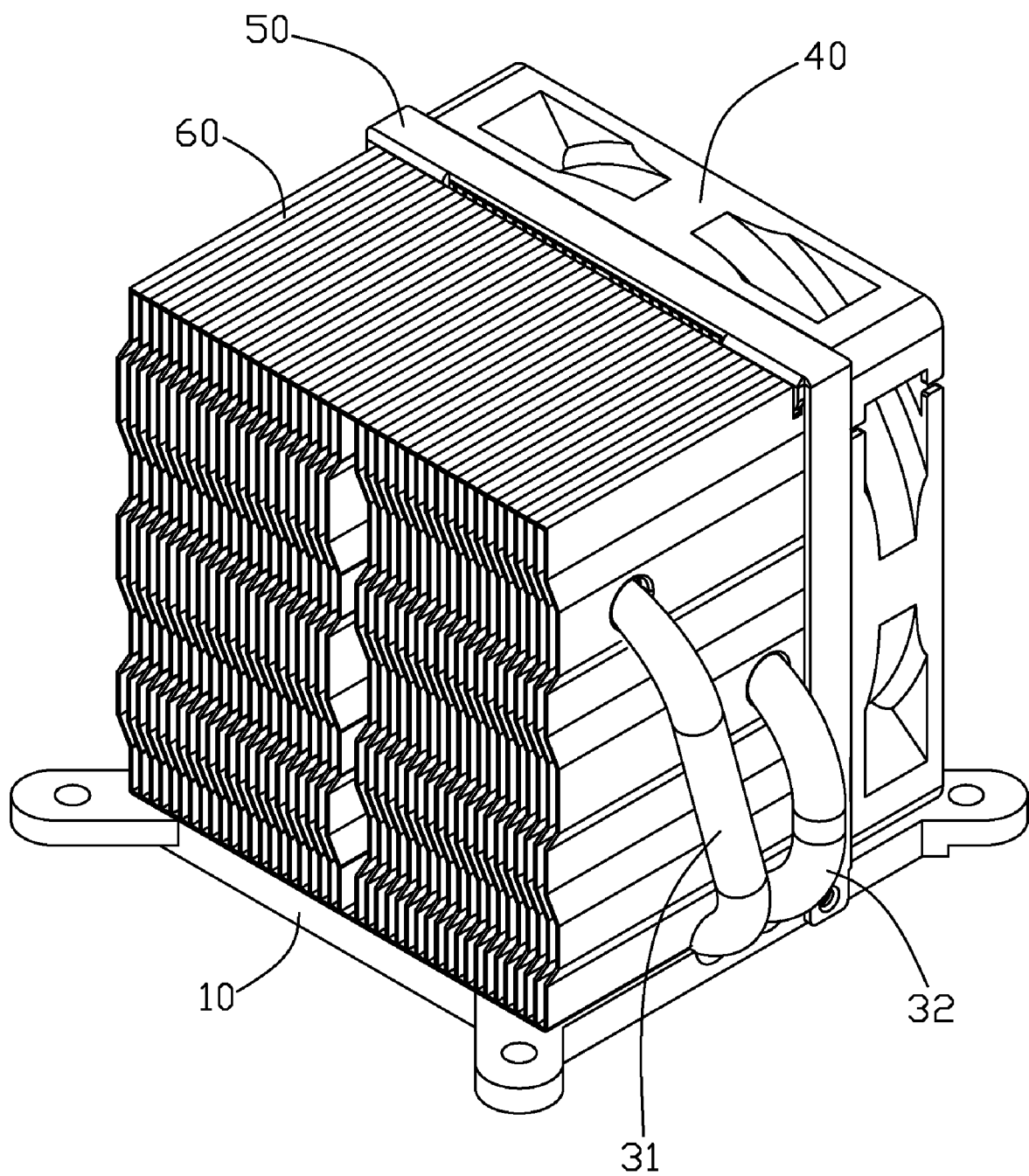
FIG. 4 is an assembled, isometric view of a heat dissipation device in accordance with an alternative embodiment of the present invention.
Figure 5:
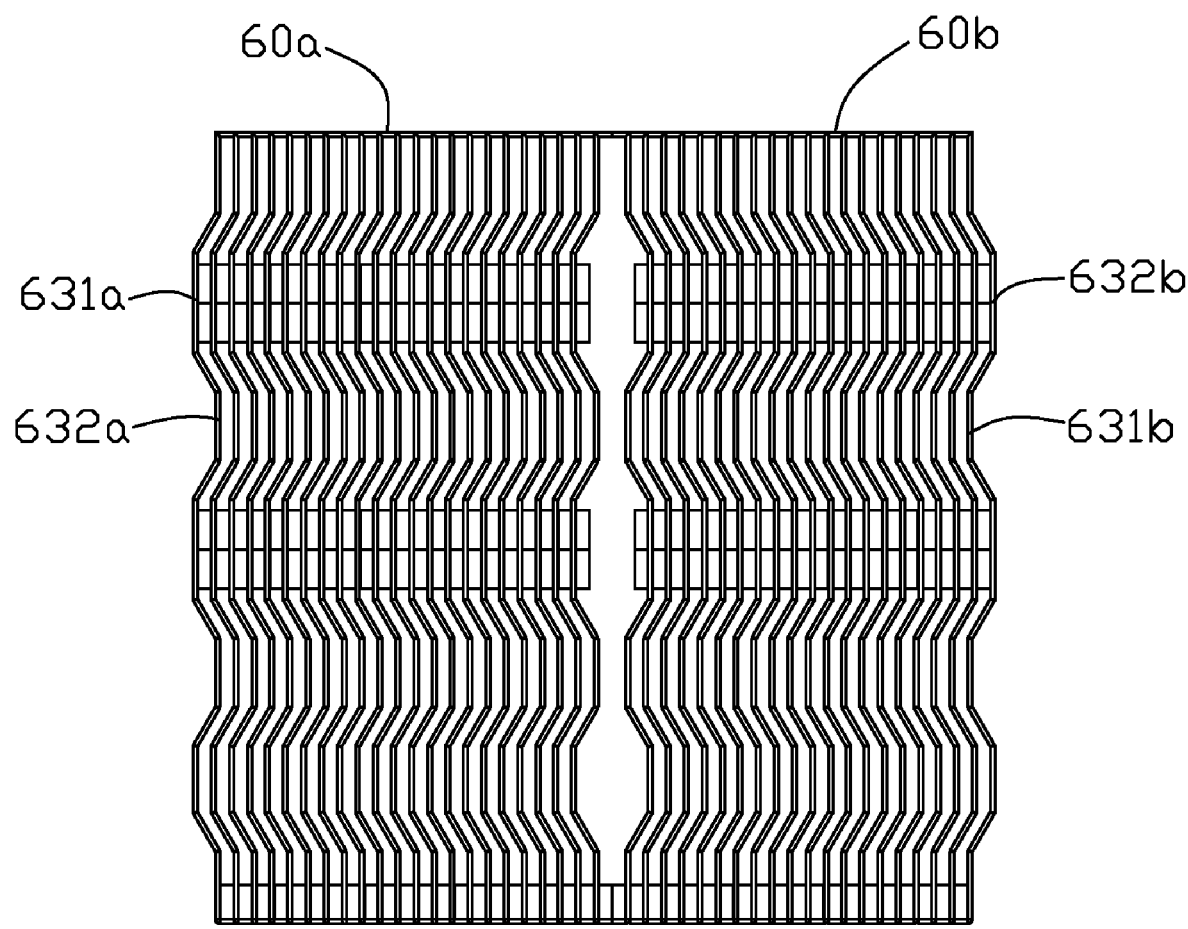
FIG. 5 is a side view of a fin set of the heat dissipation device of FIG. 4.

Referring to FIGS. 4 and 5, a heat dissipation device in accordance with an alternative embodiment of the present invention is shown. The heat dissipation device is similar to the preferred embodiment, and difference therebetween is that a fin set 60 of the heat dissipation device of the alternative embodiment comprises a first fin unit 60a and a second fin unit 60b symmetrical to the first fin unit 60a. In other words, the second fin unit 60b is a mirror image to the first fin unit 60a. Trough faces 631a of the fins of the first fin unit 60a are located corresponding to peak faces 632b of the fins of the second fin unit 60b, while peak faces 632a of the fins of the first fin unit 60a are located corresponding to the trough faces 631b of the fins of the second fin unit 60b. A wider passage (not labeled) is defined between the first fin unit 60a and the second fin unit 60b.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base for absorbing heat from a heat generating device;
   a fin set comprising a plurality of fins extending from the base, each of the fins having an undulating body, the body comprising a plurality of peak faces, a plurality of trough faces and slanted faces each located between adjacent peak face and trough face, the peak faces of the body of each of the fins conforming to corresponding peak faces of the body of an adjacent fin of the fin set;
   at least a heat pipe having a first section contacting the base and a second section extending through the fin set for transferring heat from the base to the fin set; and
   a second fin set which is symmetrical and mirror image to the aforesaid fin set, wherein the second fin set comprises a plurality of second fins extending from the base;
   wherein each of the fins of the fin set comprises a bottom flange and a top flange extending from two opposite edges of the body;
   wherein the bottom flanges of the fins of the fin set cooperatively form a bottom face contacting the base; and
   wherein the first section of the at least a heat pipe extends through the bottom face of the fin set.

2. The heat dissipation device of claim 1 wherein each of the fins of the second fin set comprises an undulating body, the body comprising a plurality of peak faces corresponding to the trough faces of the fins of the aforesaid fin set and a plurality of trough faces corresponding to the peak faces of the fins of the aforesaid fin set.

3. The heat dissipation device of claim 2, wherein each of the fins of the second fin set comprises a bottom flange and a top flange extending from two opposite edges of the body thereof, the bottom flanges of the fins of the fin set thermally contacting the base.

4. The heat dissipation device of claim 1 further comprising a fan attached to the fin set by a fan holder, wherein the fin set defines a slit extending through the top flanges of the fins of the fin set adjacent to one lateral end thereof, the fan holder extending a positioning tab engaged in the slit.

5. The heat dissipation device of claim 4, wherein the fan holder comprises a faceplate having the fan attached thereto, and a frame extending from the faceplate and engaging with the fin set via the positioning tab extending from the frame.

6. A heat dissipation device comprising:

a fin set comprising a plurality of fins, each of the fins having an undulating body and two flanges extending from two opposite edges of the body, the body comprising a plurality of peak faces and a plurality of trough faces alternating with the peak faces, wherein the peak faces of each of the fins are located corresponding to the peak faces of an adjacent fin of the fin set, while the trough faces of each fin are located corresponding to the trough faces of the adjacent fin of the fin set, a plurality of undulating passages being defined between two adjacent fins of the fin set;

a fan located corresponding to the passages of the fin set for providing forced airflow to the fin set; and a second fin set which is symmetrical and mirror image to the aforesaid fin set, wherein the second fin set comprises a plurality of second fins each having a body which comprises a plurality of peak faces and a plurality of trough faces alternating with the plurality of peak faces of the second fins, wherein the peak faces of the body of each second fin correspond to the trough faces of the bodies of the fins of the aforesaid fin set, while the trough faces of the body of each second fin correspond to the peak faces of the bodies of the fins of the aforesaid fin set.

7. The heat dissipation device of claim 6, wherein the fan is attached to the fin set by a fan holder, the fan holder comprising a faceplate mounting the fan thereon and a frame extending from the faceplate and engaging with the fin set.

8. The heat dissipation device of claim 7, wherein the frame of the fan holder comprises two opposite lateral laths sandwiching the fin set therebetween and a top lath connecting the two lateral laths and located atop the fin set.

9. The heat dissipation device of claim 8, wherein the top lath of the frame of the fan holder extends at least a positioning tab into engagement in a slit defined in a top face of the fin set.

10. The heat dissipation device of claim 6, wherein each of the fins comprises two flanges extending from two opposite edges of the body, corresponding flanges of the fins of the fin set forming two faces at two opposite sides of the bodies of the fins of the fin set.

11. The heat dissipation device of claim 6 further comprising a base and a heat pipe connecting the base and the fin set for transferring heat from the base to the fin set.

* * * * *